Nov. 9, 1965 F. W. WEBER 3,217,172

DELAY CIRCUIT EMPLOYING COUPLING CIRCUIT BETWEEN TWO TIME DELAY CIRCITS

Filed Aug. 1, 1961

INVENTOR.
FRANK W. WEBER
BY
Christie, Parker & Hale
ATTORNEYS.

3,217,172

DELAY CIRCUIT EMPLOYING COUPLING CIRCUIT BETWEEN TWO TIME DELAY CIRCUITS

Frank W. Weber, Duarte, Calif., assignor to Burroughs Corporation, Detroit, Mich., a corporation of Michigan Filed Aug. 1, 1961, Ser. No. 128,588
17 Claims. (Cl. 307—88.5)

Figure 1:
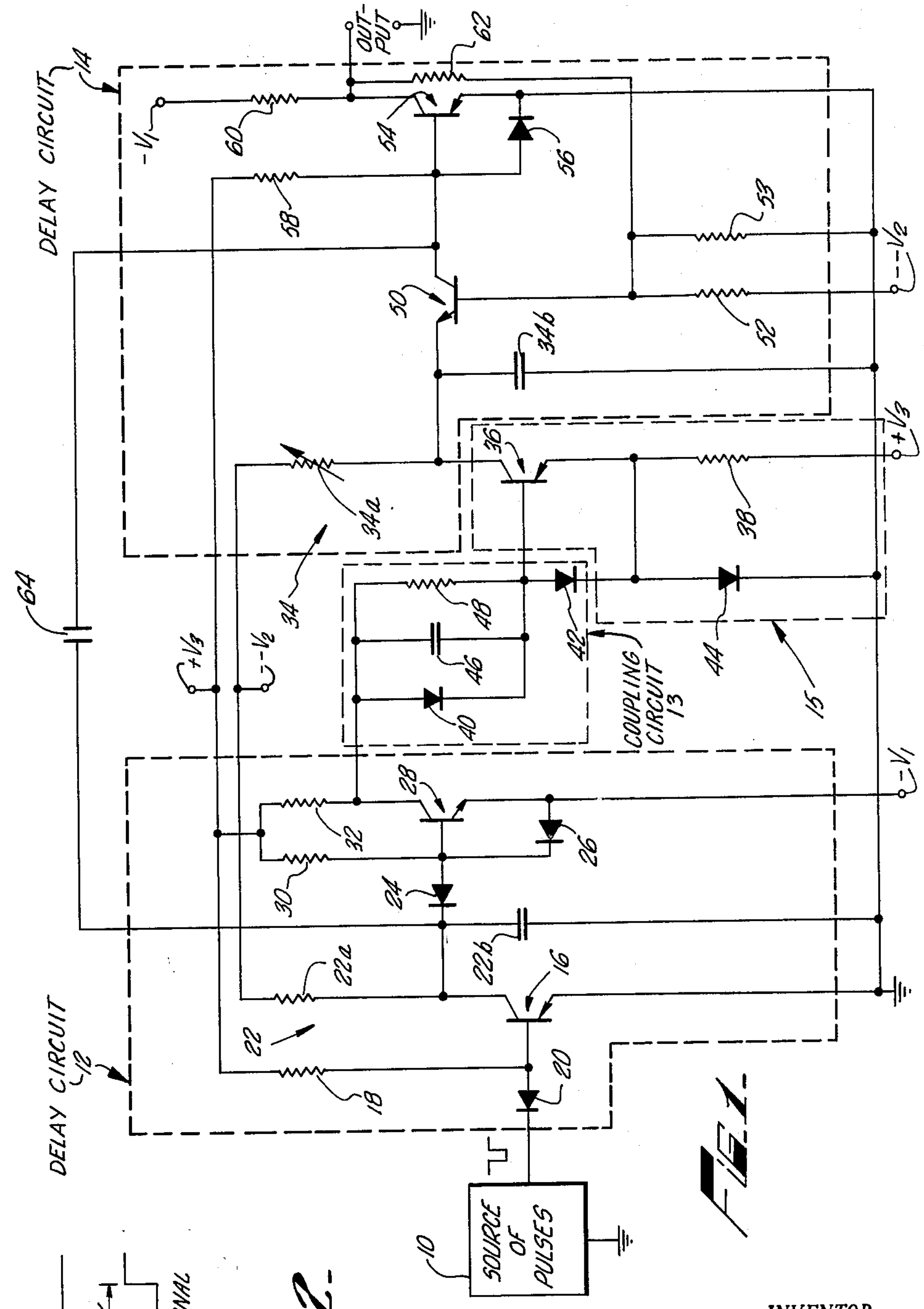

This invention relates to electronic circuits and more particularly to time delay circuits.

Time delay circuits are known having a first transistor with its collector electrode coupled by means of a zener diode to the input circuit of a second transistor. A capacitor is coupled across the collector and emitter electrodes of the first transistor. When the delay circuit is in a quiescent condition, the capacitor is charged and the first and second transistors are in non-conductive and conductive conditions, respectively.

An input pulse applied to the first transistor switches it into a conductive condition causing the capacitor to discharge through the first transistor. When the voltage across the capacitor discharges to the correct level, the second transistor switches into a non-conductive condition providing an output pulse.

With this circuit arrangement the capacitor applies a voltage across the collector and emitter electrodes of the first transistor at the same time the discharge current flows from the capacitor. This prevents the first transistor from saturating and causes excessive power dissipation therein.

It is desirable to keep the ratio of the time during which the second transistor is in a non-conductive condition, the delay time, to the time required to discharge the capacitor as high as possible. To increase this time ratio, the input current to the first transistor may be increased or the gain of the transistor may be increased. Also, the value of the load resistor for the first transistor may be increased. An increase in the input current or the gain of the first transistor causes a higher power dissipation in the transistor. An increase in the value of the load resistor reduces the total amount of loading current for the transistor causing the charging and discharging time of the capacitor to be dependent on the collector cutoff current in the transistor. The cutoff current in a transistor is extremely dependent on temperature causing this arrangement to be undesirable if accurate timing is required.

In contrast, the present invention provides a delay circuit which greatly increases the delay ratio and yet the dissipation in the charging and discharging transistor is greatly reduced over that of previous delay circuits by maintaining it in a saturated condition. In addition, the time for rise and fall of the output signal from the delay circuit are made very short. Also, the accuracy of the delay is increased over previous delay circuits by reducing the effects due to variations in voltages and temperature.

Briefly, one specific embodiment of the present invention comprises first and second time delay circuits. A transistor element is connected to the input circuit of the second time delay circuit for providing current signals thereto. An impedance element is coupled to the emitter electrode of the transistor for limiting the current applied to the capacitor and for biasing the transistor element into a saturated condition whenever it is in a conductive condition. A unilateral conductive element is also connected to the emitter electrode for providing a reference signal to a timing capacitor in the second delay circuit.

A special coupling circuit is provided for coupling the first time delay circuit to the base electrode of the transistor element. This coupling circuit provides sufficient current to the transistor element to maintain it in a saturated condition.

Figure 2:
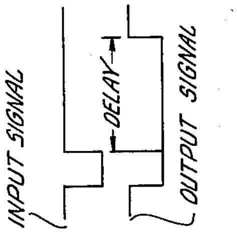

A better understanding of the present invention may be obtained with reference to the following description and figures of which:

FIG. 1 is a detailed schematic diagram of a delay circuit embodying the present invention; and FIG. 2 is a wave shape diagram illustrating the relationship of the applied input signal to the output signals of the time delay circuit of FIG. 1.

Refer now to the wave shape diagram of FIG. 2 wherein the output signal of the delay circuit of FIG. 1 is shown in response to an input pulse shown therein. As indicated, the delay circuit is responsive to a negative input pulse to develop an output pulse which always begins substantially at the beginning of an input pulse and lasts for a predetermined time duration after the termination of the input pulse. The delay time after the termination of an input pulse is the required delay and is a constant.

Refer now to the details of the delay circuit as shown in the schematic diagram of FIG. 1 and which embodies the present invention. In the following discussion two negative power supplies are referred to but not shown and are designated the negative power supply $-V_1$ and $--V_2$. The power supply $--V_2$ should be distinguished from the negative power supply $-V_1$ in that it has a more negative output potential than the power supply $-V_1$. Also, a positive power supply is referred to, but not shown, and is designated $+V_3$.

A source of pulses 10 is provided and is coupled to the input circuit of a time delay circuit 12. The output circuit of the time delay circuit 12 is connected by means of a special coupling circuit 13 and a switching circuit 15 to the input circuit of a time delay circuit 14.

The time delay circuit 12 includes a switching circuit having a PNP transistor element 16, a biasing resistor 18, and a diode element 20. The diode 20 is for isolation and is poled with its cathode electrode connected to the output of the source of pulses 10 and with its anode electrode connected in common to the base of the transistor 16 and one end of the resistor 18. The other end of the biasing resistor 18 is connected to the positive power supply, $+V_3$. The emitter and collector electrodes of the transistor 16 are connected to ground (zero volts potential) and the input circuit of a timing circuit 22, respectively.

The timing circuit 22 has a resistive element **22*a* and a capacitive element 22*b*** serially connected between the negative power supply $--V_2$ and ground.

A switching circuit is provided in the timing circuit 22 and includes diodes 24 and 26, an NPN transistor 28, a bias resistor 30 and a load resistor 32. The diodes 24 and 26 are serially connected through their cathode to anode electrodes from the junction of the resistor **22*a* and the capacitor 22*b* to the $-V_1$ power supply. The base and emitter electrodes of the transistor 28 are connected to the anode electrodes of the diodes 24 and 26, respectively. The base and collector electrodes of the transistor 28 are serially connected through the bias resistors 30 and load resistor 32**, respectively, to the positive power supply $+V_3$.

The switching circuit 15 includes a PNP transistor 36, a bias and current limiting resistor 38, and a diode 44.

The collector electrode of the transistor 36 is connected to the junction of the resistor 34*a* and the capacitor 34*b*. The emitter electrode of the transistor 36 is serially connected through the resistor 38 to the positive power supply $+V_3$. The anode and cathode electrodes of the diode 44 are connected to the emitter electrode of transistor 36 and ground, respectively.

The coupling circuit 13 includes diodes 40 and 42, a capacitor 46 and a resistor 48. The diode 40, the capacitor 46 and the resistor 48 are connected in parallel and connected between the base electrode of the transistor 36 and the collector electrode of the transistor 28. The diode 40 is connected with its anode electrode connected to the transistor 28. The anode and cathode electrodes of the diode 42 are connected to the base and emitter electrodes, respectively, of the transistor 36.

A timing circuit 34 is provided in the delay circuit 14. The timing circuit 34 comprises a variable resistor 34*a* and a capacitor 34*b* which are connected in series between the negative power supply $--V_2$ and ground.

The delay circuit 14 also has a switching circuit comprising the common base connection of an NPN transistor 50 and voltage divider resistors 52 and 53. The voltage divider resistors 52 and 53 are connected in series between the negative power supply $--V_2$ and ground. The transistor 50 has its emitter electrode connected to the junction formed by the resistor 34*a* and the capacitor 34*b* and its base electrode connected to the junction formed by the voltage divider resistors 52 and 53.

The delay circuit 14 has another switching circuit including a PNP type transistor 54, a diode 56, a bias resistor 58, and a loading resistor 60. The bias resistor 58 and the diode 56 are serially connected between the positive power supply $+V_3$ and ground. The diode 56 is poled with its cathode connected to ground. The transistor 54 has its base electrode connected to a junction formed by the bias resistor 58 and the diode 56, its collector electrode connected through the loading resistor 60 to the negative power supply $-V_1$ and its emitter electrode connected to ground. The output circuit of the delay circuit of FIG. 1 is provided at the collector electrode of the transistor 54.

Two coupling circuits are provided for further improving the operation of the delay circuit of FIG. 1. One of these coupling circuits is a capacitor 64 for coupling the junction of the resistor 22*a* and capacitor 22*b*, of the delay circuit 12, to the base electrode of the transistor 54, of the delay circuit 14. The other coupling circuit is a resistor 62 connected between the collector electrode of the transistor 54 and the base electrode of the transistor 50.

Refer now to the operation of the delay circuit of FIG. 1. Assume initially that the delay circuit is in a quiescent condition. The input signal applied to the diode 20 is at ground, the transistors 16, 28 and 36 are biased into non-conductive conditions and the transistors 50 and 54 are biased into conductive conditions. This allows the capacitor 22*b* to be charged negatively to the point where both the diodes 24 and 26 are forward biased, and the charge across the capacitor 22*b* is slightly greater than the output potential of the $-V_1$ power supply. The diode 26 also prevents the reverse bias on the transistor 28 from being excessive and causing a reverse voltage breakdown therein.

Since the transistor 28 is in a non-conductive condition, its collector electrode tends to rise toward a potential equal to that out of the positive power supply $+V_3$. However, the diodes 40, 42 and 44 become forward biased and clamp the potential slightly above ground. The potential across the diode 42 reverse biases the base emitter electrodes of the transistor 36. With transistor 36 in a non-conductive condition, the potential across the capacitor 34*b* tends to drop towards a potential equal to that out of the negative power supply $--V_2$. However, the conductive transistor 50 clamps the potential at a potential essentially equal to that applied to its base electrode.

First consider the operation of the delay circuit of FIG. 1 as if the capacitor 64 and resistor 62 were not connected in the circuit. Assume that the source of pulses 10 provides a negative input pulse to the delay circuit. A negative input pulse causes the cathode electrode of the diode 20 to drop to a negative potential and the transistor 16 to switch into a conductive condition. This causes a short circuit (neglecting the emitter to collector resistance of transistor 16) to be applied across the plates of the capacitor 22*b*. The capacitor 22*b* immediately starts discharging and the collector of the transistor 16 starts rising toward ground potential. When the potential at the collector electrode of the transistor 16 rises slightly above the potential out of the $-V_1$ power supply, the diodes 24 and 26 are reverse biased and the transistor 28 switches into a saturated conductive condition due to current from the power supply $+V_3$ through the bias resistor 30. This causes the potential at the collector electrode of the transistor 28 to drop to a potential equal to that out of the negative power supply $-V_1$ (neglecting the collector to emitter potential drop across the transistor 28). This negative change in potential is coupled through the capacitor 46 to the base electrode of the transistor 36 switching it into a saturated conductive condition. Immediately current starts flowing from the positive power supply $+V_3$ to the capacitor 34*b* via the bias resistor 38 and the transistor 36.

It is important to note that the potential drop across the resistor 38, due to current flow therethrough, causes the potential at the emitter electrode of the transistor 36 to drop to a potential essentially equal to that at its collector electrode. This allows the transistor 36 to be immediately biased into a saturated conductive condition. Thus, although a large amount of current flows through the transistor 36, the voltage drop across its collector to emitter electrodes, therefore, power dissipation therein is very small. Also, when the transistor 36 is in a conductive condition discharging capacitor 34*b*, it provides a linear discharge current whose magnitude is limited by the resistor 38.

Current continues to flow through the saturated transistor 36 discharging the capacitor 34*b*. Subsequently, the potential applied to the emitter electrode of the transistor 50 rises above the potential applied to its base electrode. At this point the transistor 50 is switched into a non-conductive condition.

When the transistor 50 switches into a non-conductive condition, the potential on the base electrode of the transistor 54 starts rising and current conduction is cut off therein. This causes the output potential at the collector electrode of the transistor 54 to drop to a negative potential essentially equal to that out of the negative power supply $-V_1$. The diode 56 prevents excessive reverse bias voltage from the base to emitter electrodes of the transistor 54.

The capacitor 22*b* subsequently discharges to a potential equal to that across the emitter and collector electrodes of the saturated transistor 16.

The capacitor 34*b* continues to discharge even after the capacitor 22*b* is completely discharged. Therefore, the potential at the collector electrode of the transistor 36 continues to rise. When the potential at the emitter electrode of the transistor 36 rises above ground the diode 44 is forward biased. At this point the diode 44 clamps the potential at the emitter electrode of the transistor 36 at ground (neglecting the potential drop across diode 44) and the capacitor 34*b* stops discharging.

Assume that the input pulse now rises back to ground potential. This causes transistor 16 to switch back into a non-conductive condition and current starts flowing from ground to the negative power supply $--V_2$ via the capacitor 22*b* and the resistor 22*a*. This causes the capacitor 22*b* to start recharging until the diodes 24 and 26 again forward bias and clamp the potential across the capacitor **22*b* equal to that out of the negative power supply $-V_1$. At this point the transistor 28** is switched into a non-conductive condition.

When transistor 28 is switched back into a non-conductive condition the potential at its collector electrode rises until the diodes 40, 42 and 44 are forward biased again and clamp the potential thereon at about ground. This causes the transistor 36 to immediately switch into a non-conductive condition.

With the transistor 36 in a non-conductive condition, current starts flowing from ground to the negative power supply $--V_2$ via the capacitor **34*b* and the resistor 34*a*. The capacitor 34*b* then starts recharging. The potential at the emitter electrode of the transistor 50 starts dropping due to the recharging of capacitor 34*b* and continues dropping until the base and emitter electrodes of the transistor 50 are again forward biased. When the base and emitter electrodes of the transistor 50 are again forward biased they again clamp the potential across the capacitor 34*b*** at a potential equal to that applied to the base electrode.

Also, when the transistor 50 is switched into a conductive condition, the transistor 54 is switched back into a conductive condition and the signal on its collector electrode rises back to ground potential. This terminates the negative delay pulse.

With the operation of the delay circuit in mind without the coupling capacitor 64 and the feedback resistor 62 consider the effect of these circuits on the operation of the delay circuit. The coupling capacitor 64 is used to force the output signal of the delay circuit to a negative potential immediately upon application of an input pulse. When an input pulse is applied, the capacitor 64 couples the initial rise in potential at the collector electrode of the transistor 16, due to discharging current to the capacitor **22*b*, to the base electrode of the transistor 54 causing it to switch into a non-conductive condition immediately and before the transistor 50 has had time to switch into a non-conductive condition. After the transistor 50 switches into a non-conductive condition it then maintains the transistor 54 in a non-conductive condition even after the coupling capacitor 64** charges.

The feedback resistor 62 couples the rise in potential developed at the end of the delay pulse on the collector electrode of the transistor 54 back to the base electrode of the transistor 50 thereby causing it to draw more current and switch the transistor 54 into a conductive condition much faster than otherwise. This causes the end of the output pulse to have a very short rise time.

The values of various elements in the delay circuit should be noted. In order to insure a constant delay time the discharge time of the capacitor **22*b*, through the transistor 16, must be equal to or less than the shortest input pulse. The reason for this is that the time delay is equal to the time required to recharge capacitor 22*b* plus the time to recharge capacitor 34*b*. Therefore, the capacitor 22*b*** must be discharged to the same point each time for accurate and constant time delays.

The pulse width of the shortest input pulse to the delay circuit may be equal to the discharge time of capacitor **22*b*. Therefore, to insure that capacitor 34*b* is completely discharged so that it will have a constant recharge time each delay cycle, the time required to discharge the capacitor 34*b* through the transistor 36 must be shorter than the time required for the capacitor 22*b* to discharge from the point where the transistor 28 is switched into a conductive condition plus the time required for the capacitor 22*b* to recharge back to the point where the transistor 28** is switched back into a non-conductive condition.

Refer now to the coupling circuit 13 and the switching circuit 15. The resistor 38 is adjusted to as low a value as possible and still allow the transistor 36 to operate without exceeding its power dissipation rating. The value of the capacitance of the capacitors 46 and **34*b* are adjusted such that the capacitance of 34*b* is equal to or less than the beta of the transistor 36 times the capacitance of 46. With these values of capacitance, the current to the base electrode of the transistor 36 will be sufficient to switch it into a saturated conductive condition. The resistor 48 has an impedance low enough to maintain the transistor 36 in a saturated condition after the capacitor 46 is charged after switching transistor 36** into a conductive condition.

Usually the delay due to the recharging time of capacitor **34*b*, via resistor 34*a*, will be very much longer than the recharge time of capacitor 22*b* via resistor 22*a*. Therefore, the width of a delay pulse is approximately equal to the delay generated in time delay circuit 34. The delay generated by time delay circuit 34 may be adjusted by changing the setting of the variable resistor 34*a***.

What is claimed is:

1. In a delay circuit, the combination which comprises a first time delay circuit connected to be responsive to applied input signals for providing an output signal, a second time delay circuit having an input circuit and arranged in response to a current signal applied at the input circuit for forming an output signal, a transistor element having base, emitter and collector electrodes, one of the latter two mentioned electrodes being coupled to the input circuit of said second time delay circuit, a first unilateral conductive element, a resistive impedance element, a capacitive element, said first unilateral conductive, resistive impedance and capacitive elements being coupled in parallel circuit relation between the base electrode of said transistor element and said first time delay circuit and arranged to be responsive to the output signal of said first time delay circuit for biasing said transistor element into a conductive condition thereby causing the transistor element to provide a current signal to the input circuit of said second time delay circuit, an impedance element coupled to the other of said emitter and collector electrodes from said second time delay circuit and arranged for biasing said transistor element into a saturated condition whenever in a conductive condition, and a second unilateral conductive element coupled to the base electrode of said transistor element for providing a bias signal thereto and thereby causing a predetermined conductive condition therein prior to output signal of said first time delay circuit.

2. In a delay circuit, the combination which comprises a first time delay circuit connected to be responsive to applied input signals for forming an output signal, a second time delay circuit having an input circuit and arranged for forming an input signal in response to a current signal applied at the input circuit thereof, a transistor element having base, emitter and collector electrodes, one of the latter two mentioned electrodes being coupled to the input circuit of said second time delay circuit, a coupling circuit connected to between the first time delay circuit and the base electrode of said transistor element and arranged for switching said transistor element into a conductive condition causing a current signal to be applied to the input circuit of said second time delay circuit in response to an output signal from said first time delay circuit, an impedance element coupled to the other of said emitter and collector electrodes for biasing said transistor element into a saturated conductive condition whenever in a conductive condition, and a unilateral conductive element coupled to the collector and emitter electrode circuit of said transistor element and arranged for clamping the potential of the collector and emitter electrode circuit at a predetermined level for limiting the total current supplied by said transistor element.

3. In a delay circuit the combination which comprises a time delay circuit connected to be responsive to applied input signals for forming an output signal, a capacitive element, a first impedance element coupled for normally tending to charge said capacitive element to a preselected condition, a transistor element having base, emitter, and collector electrodes, one of the latter two electrodes being coupled to said capacitive element, means coupled to said base electrode and arranged to be responsive to the output signal of said time delay circuit for biasing said transistor element into a conductive condition for providing a first charging current to said capacitive element and responsive to the absence of the signal from said time delay circuit for biasing said transistor element into a non-conductive condition for providing a second charging current to said capacitive element, resistive impedance means coupled to the other one of said emitter and collector electrodes from said capacitive element for biasing said emitter and collector electrodes to essentially the same potential during the time said transistor is in a conductive condition, and switching means coupled to said capacitive element and arranged in response to a predetermined signal in said capacitive element for providing an output signal.

4. In a delay circuit the combination which comprises a time delay circuit connected to be responsive to applied input signals for forming an output signal, a capacitive element, a first impedance element coupled for normally tending to charge said capacitive element to a preselected condition, a transistor element having base, emitter, and collector electrodes, one of the latter two electrodes being coupled to said capacitive element, means coupled to said base electrode and arranged in response to the output signal of said time delay circuit for biasing said transistor element into a conductive condition for causing the transistor element to provide a first charging current to said capacitive element and responsive to the absence of the signal from said time delay circuit for biasing said transistor element into a non-conductive condition, impedance means coupled to the other one of said emitter and collector electrodes from said capacitive element for biasing both of said emitter and collector electrodes to essentially the same potential during the time said transistor is in a conductive condition, and switching means comprising at least one transistor element having base, emitter and collector electrodes and arranged having the emitter and collector electrode circuit thereof coupled to the capacitive element and arranged for biasing said at least one transistor such that an output signal is formed thereby in response to a predetermined signal stored on said capacitive element.

5. In a delay circuit as defined in claim 4 wherein said transistors have different type electrodes coupled to the same side of said capacitive element.

6. In a delay circuit as defined in claim 5 including an impedance element coupled for providing a charging current to said capacitive element, a voltage divider circuit coupled to the base electrode of said at least one transistor, and a common source of potential coupled both to the voltage divider circuit and to the opposite side of said first impedance element from said capacitive element for causing the charging and discharging of said capacitive element to be essentially independent of variations in said source of potential.

7. In a delay circuit the combination which comprises a time delay circuit connected to be responsive to applied input signals for providing an output signal, a capacitive element, a first impedance element coupled for normally tending to charge said capacitive element to a preselected condition, a transistor element having base, emitter, and collector electrodes, one of the latter two electrodes being coupled to said capacitive element, means coupled to be responsive to the output signal of said time delay circuit for applying a signal to said base electrode biasing said transistor element into a conductive condition causing the transistor element to provide a first charging current to said capacitive element and responsive to the absence of the signal from said time delay circuit for biasing said transistor element into a non-conductive condition for causing the transistor element to provide a second charging current to said capacitive element, a resistive impedance element coupled to the other one of said emitter and collector electrodes from said capacitive element for biasing said emitter and collector electrodes to essentially the same potential during the time said transistor is in a conductive condition, a unilateral conductive element coupled to said emitter and collector electrode circuit and arranged for clamping the potential formed thereat and thereby provide a reference for the signal stored in said capacitive element, and switching means comprising at least one transistor element having base, emitter and collector electrodes and arranged having the emitter and collector electrode circuit thereof coupled to said capacitive element and means for biasing the base electrode of the latter mentioned transistor and thereby cause an output signal therefrom in response to a predetermined signal stored in said capacitive element.

8. A delay circuit comprising a first capacitive element, first switching means including a first impedance element coupled and arranged for normally providing a charging current to said first capacitive element and coupled to be responsive to an applied input pulse for providing a discharge current to said first capacitive element, second switching means having first and second conductive states and normally arranged in the first state, said second switching means being coupled to said first capacitive element and arranged to be responsive to a preselected charged condition thereof to be switched into said second state, a second capacitive element, a second impedance element coupled for providing a charging current to said second capacitive element, a transistor element having base, emitter, and collector electrodes, said transistor element having one of the latter two mentioned electrodes coupled to said second capacitive element and normally arranged in a non-conductive condition, a coupling circuit connected to at least the base electrode of said transistor element and arranged for biasing said transistor element into a conductive condition for causing a discharging current to be applied to said second capacitive element in response to the second state of said second switching means, a third impedance element connected to the other of said emitter and collector electrodes from that coupled to said second capacitive element for biasing said transistor element such that the potentials on said emitter and collector electrodes are essentially equal during the time said transistor element is in a conductive condition, and a unilateral conductive element coupled to the common junction formed by said third impedance element and said transistor element and arranged for providing a limiting signal thereto and thereby provide a reference signal for said second capacitive element.

9. A delay circuit comprising a first capacitive element, a first impedance element coupled for providing a charging current to said first capacitive element, first switching means coupled to said first capactive element and arranged in response to an applied input pulse for providing a discharge current to said first capacitive element, second switching means having first and second conductive states and normally arranged in the first state, said second switching means being coupled to said first capacitive element and arranged to be responsive to a preselected charged condition thereof for switching into said second state, a second capacitive element, a second impedance element coupled for providing a charging current to said second capacitive element, a first transistor element having base, emitter, and collector electrodes, said first transistor element having one of the latter two mentioned electrodes thereof coupled to said second capacitive element and arranged in a normal non-conductive condition, a coupling circuit connected to at least the base electrode of said first transistor element and arranged to be responsive to the second state of said second switching means for biasing said first transistor element into a conductive condition and thereby cause the first transistor element to apply a discharging current signal to said second capacitive element, a third impedance element connected to the other of said emitter and collector electrodes from that coupled to said second capacitive element for biasing said first transistor element such that the potentials on said emitter and collector electrodes are essentially equal during the time said first transistor element is in a conductive condition, a unilateral conductive element coupled to the common junction formed by said third impedance element and said transistor element for limiting the signal thereat for providing a reference signal for said second capacitive element, a second transistor element comprising base, emitter and collector electrodes and arranged with said emitter and collector electrode circuit coupled to said second capacitive element, means for biasing and causing said second transistor element to be switched into a predetermined conductive condition in response to a predetermined charged condition of said second capacitive element, third switching means coupled to the collector-emitter electrode circuit of said second transistor element, said third switching means being responsive to the predetermined conductive condition of said second transistor element for forming an output signal, and a third capacitive element connected and arranged to be responsive to discharge currents applied to said first capacitive element for applying a switching signal to said third switching means for causing said third switching means to form the output signal thereof substantially instantaneously after the application of an input pulse to said first switching means.

10. In a delay unit the combination comprising: a delay circuit having an input circuit and comprising at least one timing capacitive element coupled in parallel circuit relation across the input circuit thereof and means for charging said capacitive element, and a circuit for discharging said capacitive element including a transistor element having emitter and collector electrodes arranged with one of the electrodes coupled to said capacitive element for providing a discharging path therefor, said transistor element being arranged for switching into a conductive condition for discharging said capacitive element through the emitter and collector electrodes of said transistor element in response to an applied input signal, said discharge circuit including an impedance device coupled to the other one of the electrodes from said capacitive element and coupled in series with said emitter and collector electrodes for biasing the electrodes of said transistor element to substantially the same potential upon receipt of such input signal by said transistor element to cause said transistor element to saturate and thereby minimize power dissipation therein during the discharge of the capacitive element.

11. In a delay unit the combination comprising: circuit means arranged to be responsive to an applied input signal for forming an output signal, a delay circuit having an input circuit and comprising at least one timing capacitive element coupled in parallel circuit relation across the input circuit thereof and means for charging said capacitive element, and a circuit for discharging said capacitive element including a transistor element having emitter and collector electrodes arranged with one of the electrodes coupled to said capacitive element for providing a discharging path therefor, said transistor element being arranged for switching into a conductive condition for discharging said capacitive element through the emitter and collector electrodes of said transistor element in response to an output signal from said circuit means, said discharge circuit including an impedance device coupled to the other one of the electrodes from said capacitive element and coupled in series with said emitter and collector electrodes for biasing the electrodes of said transistor element to substantially the same potential upon receipt of said output signal by said transistor element for causing said transistor element to saturate and thereby minimize power dissipation therein during the discharge of the capacitive element.

12. In a delay unit the combination comprising: a time delay circuit including an input circuit and a connected capacitive circuit for providing a decaying discharge signal to the input circuit commencing initially with a signal having a high voltage and current characteristic across said input circuit, and a circuit for discharging said capacitive circuit including a transistor element having emitter and collector electrodes arranged with one of the electrodes coupled to said input circuit, said transistor element being arranged for switching into a conductive condition for providing a discharging path through the collector and emitter electrodes of said transistor element in response to an applied input signal, said discharging circuit including an impedance device coupled to the other one of the electrodes from the one coupled to said input circuit and coupled in series with said emitter and collector electrodes for biasing the electrodes of said transistor element to substantially the same potential upon receipt of such input signal by said transistor element for causing said transistor element to saturate and thereby minimize power dissipation therein during the discharge of the capacitive circuit.

13. In a delay unit as defined in claim 12 wherein said transistor element includes a base electrode and wherein said discharging circuit includes a second time delay circuit arranged for forming an output signal in response to an applied input signal and a coupling circuit including a resistive impedance element for applying the output signal of said second time delay circuit to said base electrode for switching said transistor element into a conductive condition.

14. In a delay unit as defined in claim 12 wherein said discharging circuit additionally includes means comprising a first unilateral conductive device coupled to the junction between the impedance device and the electrode of said transistor element for limiting the total amount of discharge by said discharge circuit.

15. In a delay circuit as defined in claim 14 wherein said transistor includes a base electrode and wherein said discharging circuit additionally comprises a second unilateral conductive device coupled in series with the first unilateral conductive device for normally biasing the base electrode of said transistor element such that said transistor element is in a nonconductive condition.

16. In combination, a circuit having at least two terminals and arranged for providing a signal therebetween characterized as having a high voltage and current characteristic, and a switching circuit coupled across said terminals for providing a current path for said signal including a transistor element having emitter and collector electrodes arranged with one of the electrodes coupled to one of said terminals, said transistor element being arranged for switching into a conductive condition for providing a current path through the collector and emitter electrode circuit thereof in response to an applied input signal thereto, said switching circuit including an impedance device coupled to the other one of the electrodes from the one coupled to one of said terminals and arranged in series with said emitter and collector electrodes for biasing the electrodes of said transistor element to substantially the same potential upon receipt of such input signal by said transistor element for causing said transistor element to saturate and thereby minimize power dissipation therein during such signal.

17. In combination, a capacitive circuit having at least two terminals and arranged for providing a current signal through a current path connected across the terminals characterized as having a high voltage and current characteristic and a switching circuit coupled for providing the current path between said terminals including a transistor element having emitter and collector electrodes arranged with one of the electrodes coupled to one of said terminals, said transistor element being arranged for switching into a conductive condition for providing a current path through the collector and emitter electrode circuit in response to an applied input signal, said switching circuit including an impedance device coupled to the other one of the electrodes from the one coupled to one of the terminals and arranged in series with said emitter and collector electrodes for biasing the electrodes of said transistor element to substantially the same potential upon receipt of such input signal by said transistor element for causing said transistor element to saturate and thereby minimize power dissipation therein during the current signal therethrough.

References Cited by the Examiner

UNITED STATES PATENTS 3,119,027 1/64 Faust ---------------- 307—88.5

OTHER REFERENCES

"Computer Delay Unit Uses Semiconductors," Electronics; vol. 30, No. 7; July 1, 1957; page 173.

ARTHUR GAUSS, *Primary Examiner.*

JOHN W. HUCKERT, *Examiner.*